(12) United States Patent
Burd

(10) Patent No.: US 11,502,021 B2
(45) Date of Patent: Nov. 15, 2022

(54) FLATPACK THERMOELECTRIC AIR CHILLER WITH PRE-COOLING CYCLE

(71) Applicant: B/E Aerospace, Inc., Winston-Salem, NC (US)

(72) Inventor: Peter J. L. Burd, Burry Port (GB)

(73) Assignee: B/E Aerospace, Inc., Winston-Salem, NC (US)

( * ) Notice: Subject to any disclaimer, the term of this patent is extended or adjusted under 35 U.S.C. 154(b) by 517 days.

(21) Appl. No.: 16/715,799

(22) Filed: Dec. 16, 2019

(65) Prior Publication Data

US 2021/0183740 A1  Jun. 17, 2021

(51) Int. Cl.
| | |
|---|---|
| H01L 23/467 | (2006.01) |
| B64D 11/04 | (2006.01) |
| B64D 13/08 | (2006.01) |
| B64D 13/06 | (2006.01) |
| H01L 23/38 | (2006.01) |

(52) U.S. Cl.
CPC ............ H01L 23/467 (2013.01); B64D 11/04 (2013.01); B64D 13/08 (2013.01); *B64D 2013/0688* (2013.01); *H01L 23/38* (2013.01)

(58) Field of Classification Search
CPC ....... H01L 23/467; H01L 23/38; B64D 11/04; B64D 13/08; B64D 2013/0688
See application file for complete search history.

(56) References Cited

U.S. PATENT DOCUMENTS

| | | | |
|---|---|---|---|
| 6,412,286 B1 * | 7/2002 | Park | .......................... H01L 35/00 62/3.6 |
| 7,467,520 B2 | 12/2008 | Van Loon et al. | |
| 9,890,975 B2 | 2/2018 | Zelissen | |
| 10,315,487 B2 | 6/2019 | Tsai et al. | |
| 10,377,493 B2 | 8/2019 | Burd | |
| 2013/0227966 A1 * | 9/2013 | Ayres | ..................... H05K 13/00 62/3.2 |

(Continued)

FOREIGN PATENT DOCUMENTS

| | | |
|---|---|---|
| GB | 798882 A | 7/1958 |
| JP | H07332829 A | 12/1995 |

(Continued)

OTHER PUBLICATIONS

Extended Search Report for European Application No. 20214613.0 dated Apr. 15, 2021, 7 pages.

*Primary Examiner* — Gordon A Jones
(74) *Attorney, Agent, or Firm* — Suiter Swantz pc llo

(57) ABSTRACT

A flatpack air chiller device is disclosed. In embodiments, the air chiller device includes a primary chiller or pre-chiller subsystem and a secondary or main chiller subsystem within a housing. The pre-chiller subsystem receives and chills ambient air via cold-side contact with a primary thermoelectric device and directs the pre-chilled ambient airstream to the hot side of a secondary thermoelectric device. The secondary or main chiller subsystem is connected to a recirculating air stream, e.g., circulating through the interior airspaces, compartments, or bays of a galley structure. The pre-chilled ambient airstream absorbs heat from the secondary hot side to progressively chill the recirculating air stream, which is in contact with the cold side of the secondary thermoelectric device before recirculation back into the galley structure interior.

13 Claims, 7 Drawing Sheets

(56) References Cited

U.S. PATENT DOCUMENTS

| | | |
|---|---|---|
| 2013/0247590 A1 | 9/2013 | Lu et al. |
| 2018/0261748 A1 | 9/2018 | Williams et al. |
| 2019/0069441 A1* | 2/2019 | Khachaturov ..... H05K 7/20909 |
| 2019/0257556 A1 | 8/2019 | Pinet et al. |
| 2019/0383844 A1* | 12/2019 | Miyazaki ............. F24F 11/0001 |

FOREIGN PATENT DOCUMENTS

| | | |
|---|---|---|
| KR | 20110075755 A | 7/2011 |
| RU | 2077685 C1 | 4/1997 |
| WO | 9419833 A1 | 9/1994 |

* cited by examiner

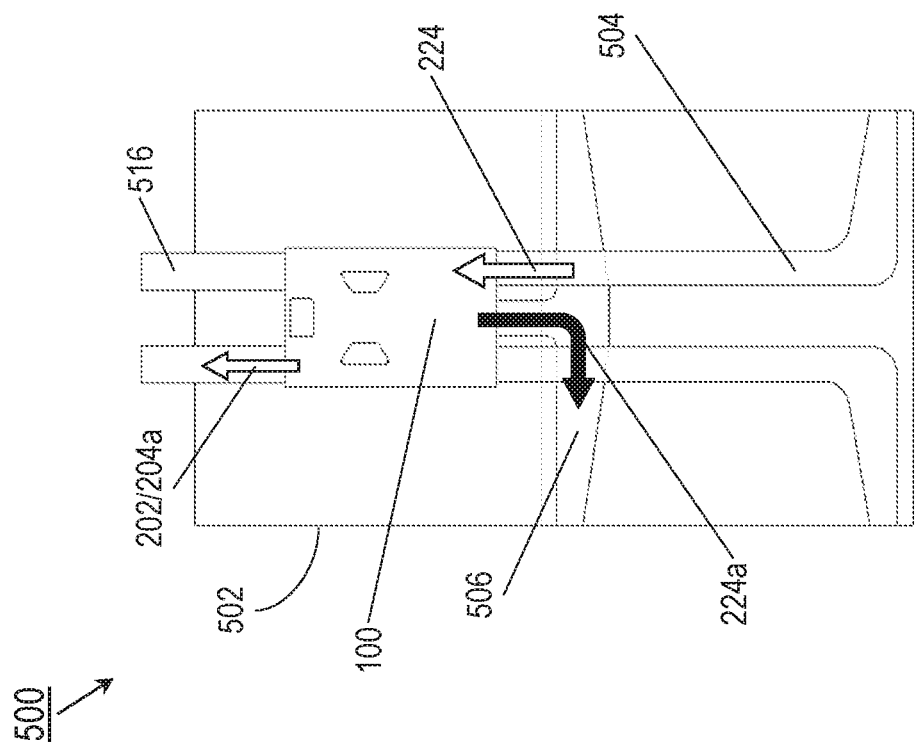
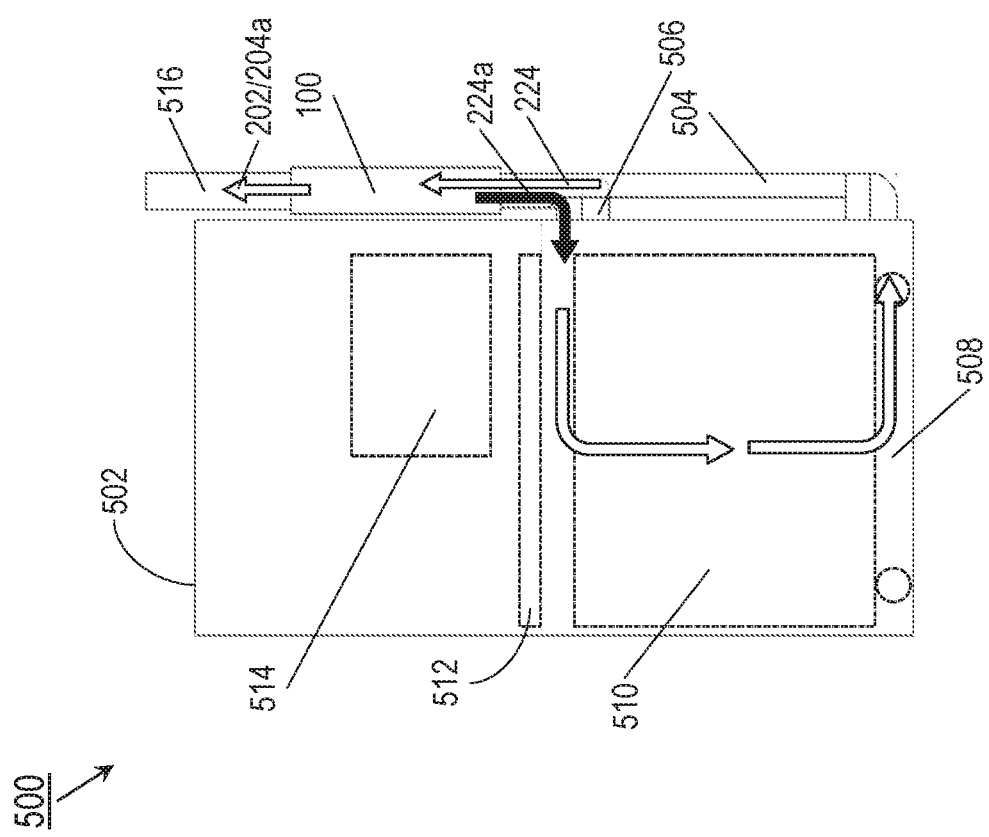

FLATPACK THERMOELECTRIC AIR CHILLER WITH PRE-COOLING CYCLE

TECHNICAL FIELD

The inventive concepts disclosed herein are directed generally to aircraft galley equipment and more particularly to air temperature regulation devices.

BACKGROUND

Thermoelectric chillers incorporate a "hot side" and a "cold side", e.g., a Peltier module or similar system, e.g., a junction of dissimilar metals or conductors, whereby when an electric current is passed through the associated voltage may correspond to a temperature differential between the two sides. For example, by cooling the "hot side", the "cold side" may be made progressively colder. However, in air-cooled thermoelectric systems, the efficiency of the Peltier effect to absorb heat from an airstream is directly tied to the ability of the ambient air to cool the "hot side"; as the temperature of the ambient air rises, a thermoelectric module cannot maintain the temperature differential, rendering the chilled air recirculated through the cold side ineffective in preserving perishable food stuffs.

SUMMARY

An air chiller device is disclosed. In embodiments, the air chiller device includes primary and secondary ambient air intakes. The air chiller device includes a primary or pre-chiller subsystem including a primary thermoelectric device in contact on both sides with the ambient air supply. The primary thermoelectric device includes a thermoelectric module for transferring heat from the "cold side" to the "hot side", pre-chilling a portion of the ambient air supply according to a voltage or current between the two sides of the module. The air chiller device includes an internal air intake for channeling the pre-chilled ambient air supply to a secondary thermoelectric device within the secondary or main chiller subsystem. The secondary thermoelectric device includes a second thermoelectric module that receives the pre-chilled ambient airstream on its hot side and a recirculating airstream on its cold side, efficiently chilling the recirculating air via heat transfer through the thermoelectric module to the pre-chilled ambient airstream. The air chiller device includes a main air return to redirect the chilled recirculating air out of the device and back to its source. The air chiller device includes control processors for managing the chilling capacity and efficiency of the device via thermoelectric control of the pre-chiller and main chiller subsystems.

An aircraft galley environment is also disclosed. In embodiments, the galley environment includes a galley structure or monument incorporating interior airspaces (e.g., temperature-controlled compartments or cart bays) chilled by an air recirculation network. The recirculating airstream may be kept chilled by an air chiller device connected to the air recirculation network by air supply and return ducts leading to and from the interior of the galley structure. The air chiller device receives the recirculating airstream, which is directed into contact with the "cold side" of a main thermoelectric device to which heat is transferred from the recirculating airstream. The opposing or "hot side" of the main thermoelectric device is in thermal contact with a pre-chilled ambient airstream which receives the transferred heat before being directed out of the chiller device via exhaust ports. The pre-chilled ambient airstream is itself chilled by cold-side contact with another thermoelectric device located in a pre-chiller subsystem. The pre-chiller thermoelectric device takes in ambient air on its hot and cold sides, pre-chilling the ambient airstream on the cold side via thermoelectric heat transfer to the ambient airstream on the hot side. The pre-chilled ambient airstream is then directed into the main chiller subsystem for hot-side contact with the main thermoelectric device before being directed out of the air chiller device through the exhaust ports.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

FIGS. 5A and 5B are respectively side and rear elevational views of an aircraft galley environment incorporating the air chiller device of FIG. 1;

DETAILED DESCRIPTION

Figure 1:
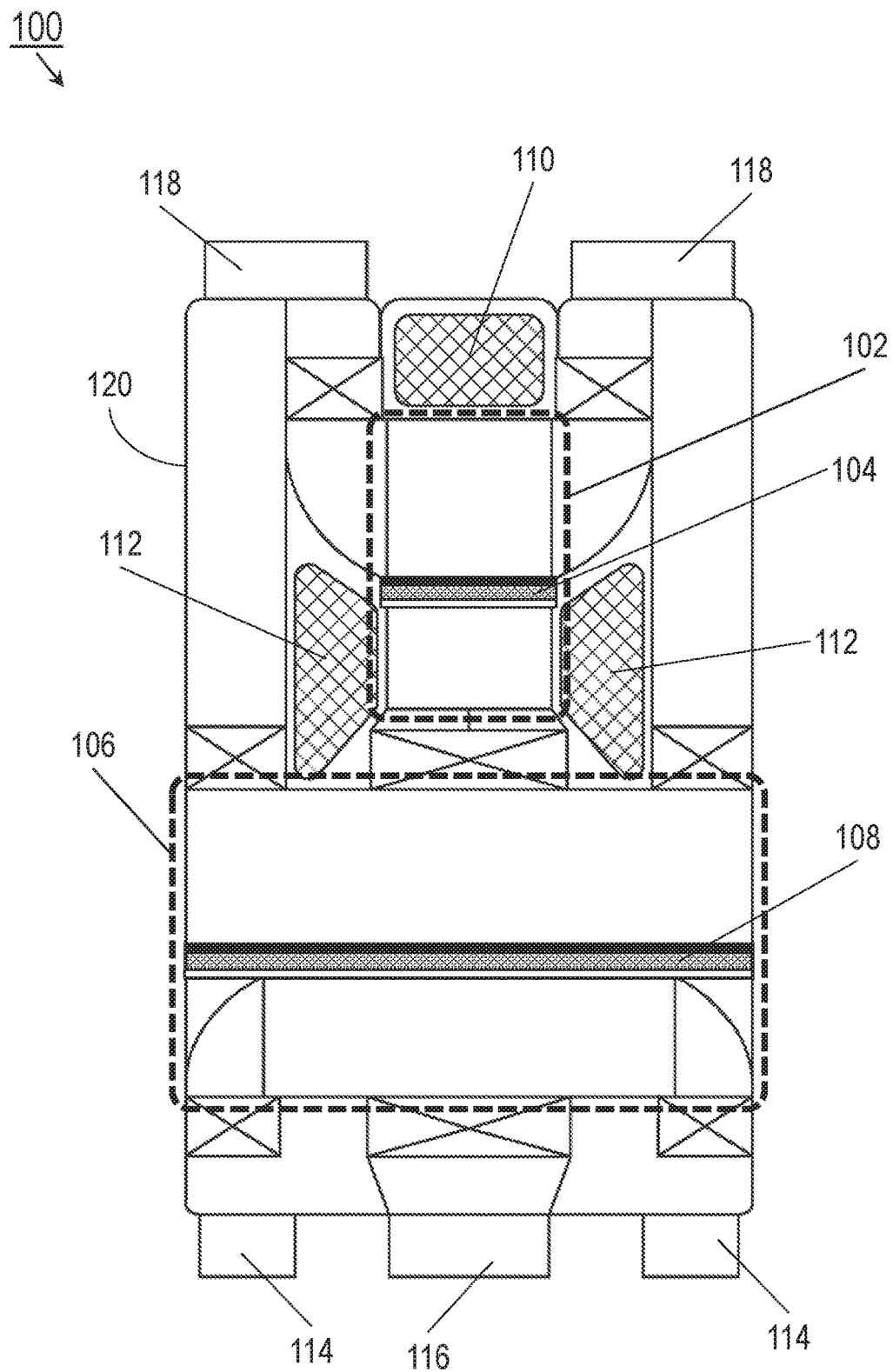
FIG. 1 is an overhead view of an air chiller device in accordance with example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Figure 2A:
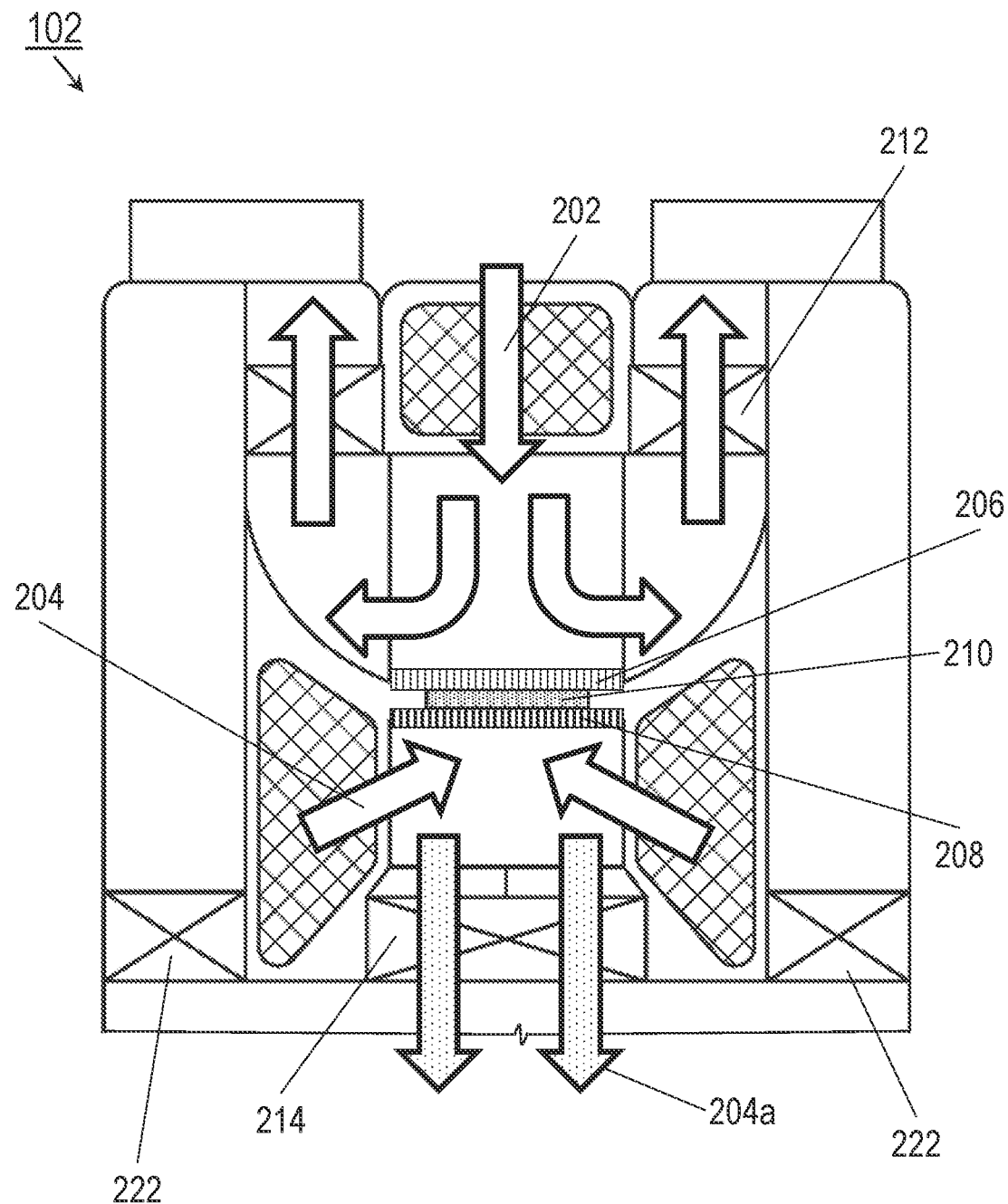
FIGS. 2A and 2B are detailed overhead views of respectively the primary and secondary chiller subsystems of the device of FIG. 1.
Figure 2B:
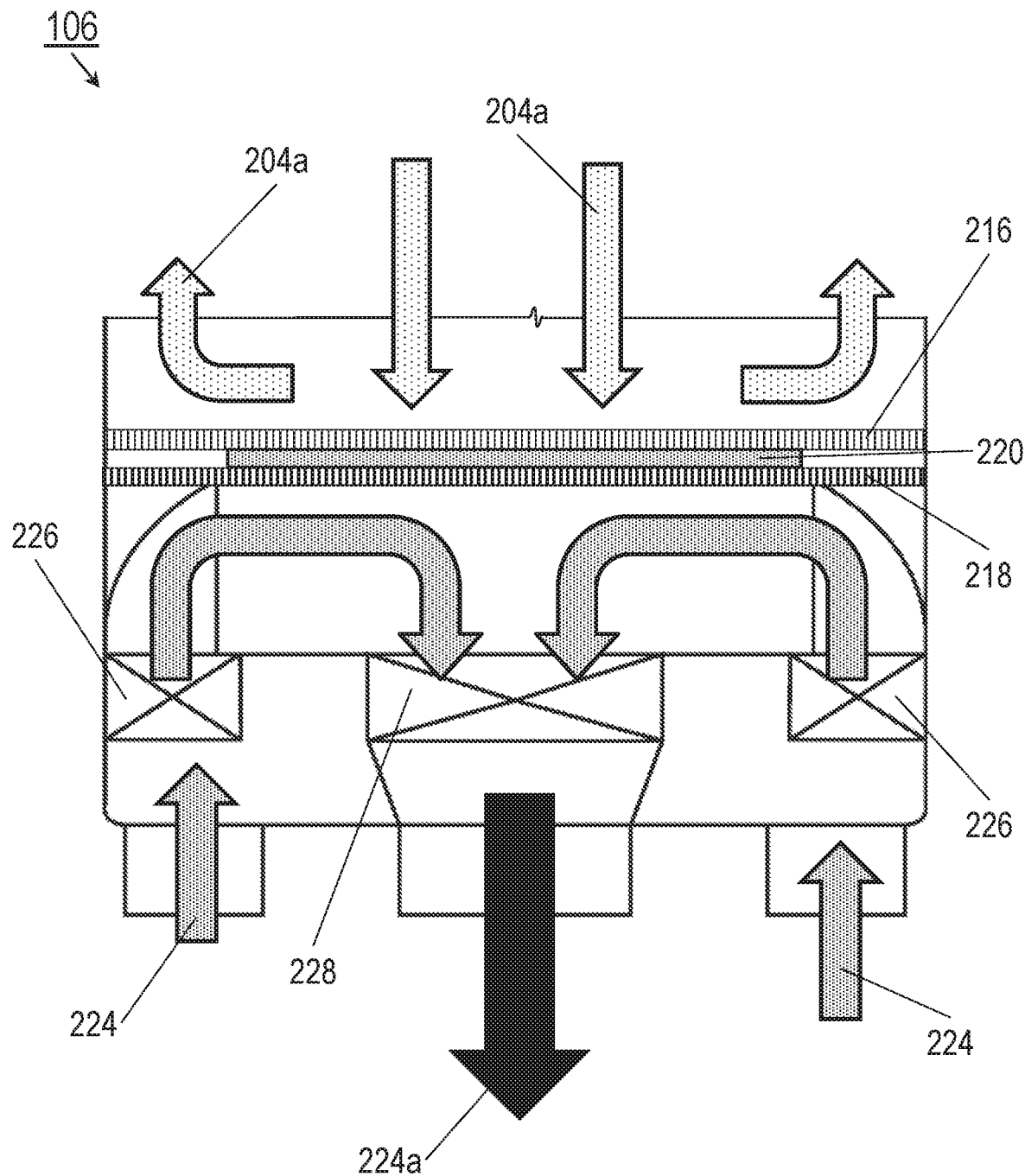

Referring generally to FIGS. 1 through 2B, a flatpack air chiller device 100 is disclosed. In embodiments, the flatpack air chiller device 100 may include a primary chiller subsystem 102 (e.g., pre-chiller) incorporating a primary thermoelectric device 104; a secondary chiller subsystem 106 (e.g., main chiller) incorporating a secondary thermoelectric device 108; primary ambient air intakes 110; secondary ambient air intakes 112; main air intakes 114; main air returns 116; and exhaust ports 118, all or some of these components being fully or partially incorporated within an external housing 120.

Referring in particular to FIG. 2A, in embodiments, the primary chiller subsystem 102 may take in ambient air from the surrounding environment. For example, the primary chiller subsystem 102 may take in a primary ambient air supply 202 via the primary air intake 110 and a secondary ambient air supply 204 via the secondary air intakes 112. The primary and secondary ambient air supplies 202, 204 may be directed to the primary thermoelectric device 104 in order to provide a pre-chilled air supply for the secondary chiller subsystem 108.

In embodiments, the primary thermoelectric device 104 may incorporate a primary "hot side" 206 (e.g., hot conductor, hot junction) and a primary "cold side" 208 connected by a primary thermoelectric module 210 (e.g., a Peltier module, junction of dissimilar conductors or metals, or other like thermoelectric assembly). For example, a voltage applied through the primary thermoelectric module 210 may create a current between the primary cold side 208 and the primary hot side 206, resulting in a transfer of heat from the primary cold side to the primary hot side. The primary ambient air supply 202 may be drawn into the primary chiller subsystem 102 and into contact with the primary hot side 206, absorbing heat from the primary hot side before being directed out of and away from the air chiller device 100 (e.g., through the exhaust ports 118) by primary exhaust fans 212. Similarly, the secondary ambient air supply 204 may be drawn into the primary chiller subsystem 102 and into contact with the primary cold side 208.

In embodiments, the absorption of heat from the primary hot side 206 may result in a further transfer of heat from the primary cold side 208 to the primary hot side, pre-chilling the secondary ambient air supply (204a) upon contact with the primary cold side. The pre-chilled secondary ambient air supply 204a may be directed by an internal air intake 214 into the secondary chiller subsystem 104.

Referring in particular to FIG. 2B, the pre-chilled secondary ambient air supply 204a may be drawn by the internal air intake 214 into the secondary chiller subsystem 104 and into contact with the secondary hot side 216 of the secondary thermoelectric device 108. Similarly, to the primary thermoelectric device 102, the secondary thermoelectric device 108 may incorporate a secondary hot side 216 and secondary cold side 218 connected by secondary thermoelectric modules 220 through which a secondary voltage may likewise create a current between the secondary hot and cold sides. Accordingly, the pre-chilled secondary ambient air supply 204a may be drawn into contact with the secondary hot side 216, absorbing heat therefrom before being drawn out of the air chiller device 100 via secondary exhaust fans 222 (FIG. 2A). In some embodiments, the exhaust ports 118 may be common to the exiting pre-chilled secondary ambient air supply 204a and the primary ambient air supply 202 exiting the primary chiller subsystem 102 via the primary exhaust fans 212.

In embodiments, the secondary chiller subsystem 106 may be part of an air recirculation network, e.g., through the interior of one or more galley structures or internal airspaces and compartments therewithin. For example, the secondary chiller subsystem 106 may receive a recirculating air supply 224 through the main air intakes 114, e.g., driven by main air intake fans 226. The recirculating air supply 224 may be driven into the air chiller device 100 and into contact with the secondary cold side 218. The absorption of heat from the secondary hot side 216 by the pre-chilled secondary ambient air supply 204a may further chill the recirculating air supply (224a) as heat is absorbed therefrom by the secondary cold side 218 and transferred to the secondary hot side, progressively chilling the secondary hot side.

In embodiments, by pre-chilling the pre-chilled secondary ambient air supply 204a, the efficiency of the air chiller device 100 may be protected against rising ambient air temperatures which may otherwise require more energy to chill the recirculating air supply 224 to a desired or necessary temperature. The chilled recirculating air supply 224a may be circulated out of the air chiller device (e.g., and back into the air recirculation network) via the main air returns 116, driven by main air return fans 228.

Figure 3:
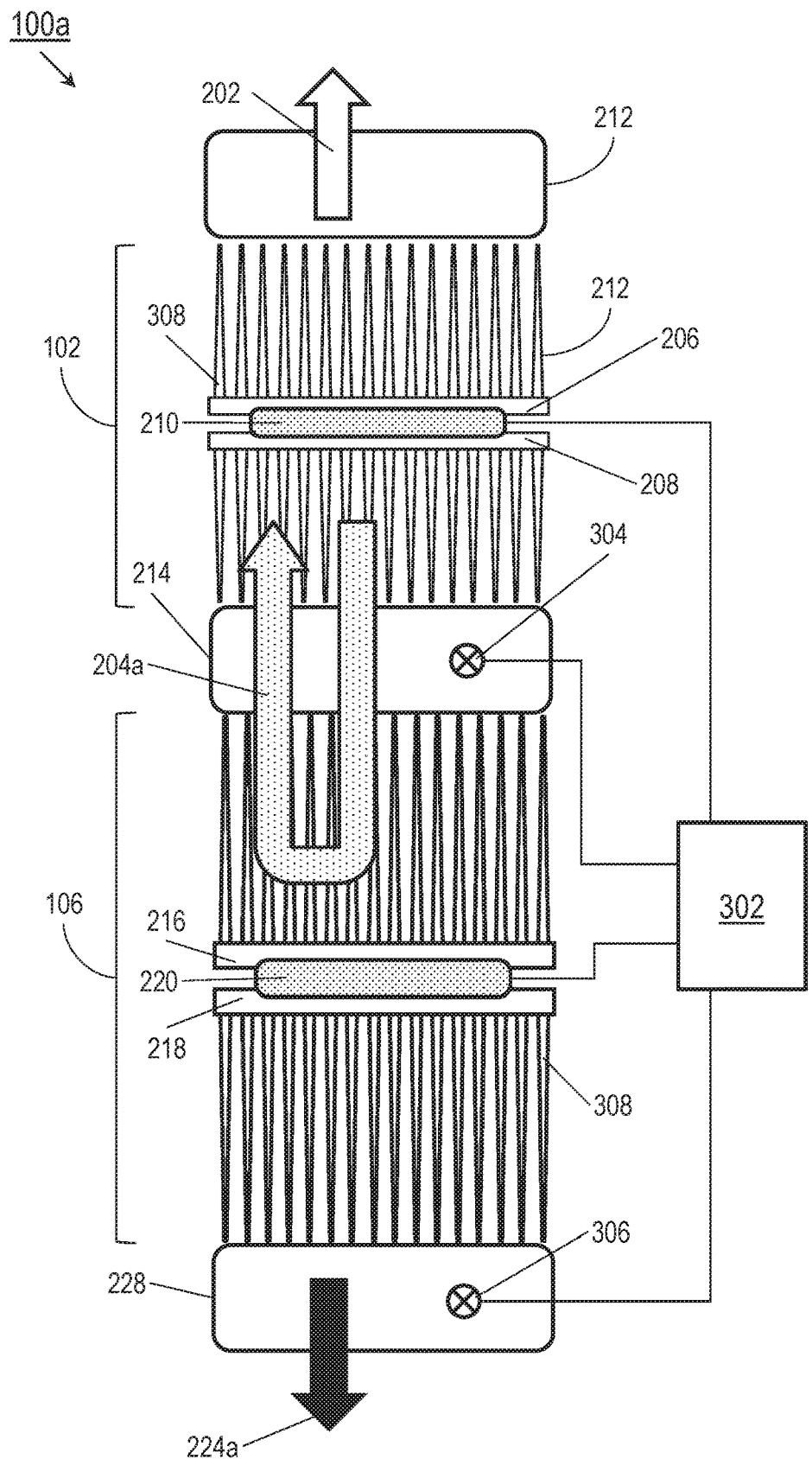
FIG. 3 is a diagrammatic side elevational view of the device of FIG. 1.

Referring to FIG. 3, the air chiller device 100a may be implemented and may function similarly to the air chiller device 100 of FIG. 1, except that the air chiller device 100a may incorporate control processors 302; temperature sensors 304, 306; and finned heat sinks 308 (e.g., heat exchangers).

In embodiments, the primary chiller subsystem 102 may pre-chill the secondary ambient air supply (204a) to a greater or lesser degree by adjusting, via the control processors 302, the voltage and corresponding current through the primary thermoelectric module 210. Similarly, the degree to which the recirculating air supply (224a) is chilled by the secondary chiller subsystem 106, the pre-chilled secondary ambient air supply 204a in turn chilling the secondary hot side 216 of the secondary thermoelectric device 108, may be regulated by adjusting, via the control processors 302, the voltage/current through the secondary thermoelectric module 220.

In embodiments, both the primary hot and cold sides 206, 208 of the primary thermoelectric device 104, as well as the secondary hot and cold sides 216, 218 of the secondary thermoelectric device 108, may incorporate finned heat sinks 308 or other similar heat exchange devices to maximize contact between the respective hot and cold sides and airstreams circulating therethrough (e.g., the pre-chilled secondary ambient air supply 204a and the recirculating air supply 224a), thereby optimizing heat absorption and thermal communication throughout the air chiller device 100a.

In some embodiments, the regulation of the primary and/or secondary chiller subsystems 102, 106 may be regulated by the temperature sensors 304, 306. For example, the temperature sensor 304 may be disposed proximate to the internal air intake 214 and thereby sense the air temperature of the pre-chilled secondary ambient air supply 204a exiting the primary chiller subsystem 102; if the sensed air temperature rises above or falls below a particular temperature threshold, the control processors 302 may respectively increase or decrease the pre-chilling capacity of the primary chiller subsystem 102 via the primary thermoelectric modules 210. Similarly, the temperature sensor 306 may be disposed proximate to the main air return fans 228 and thereby sense the air temperature of the chilled recirculating air supply 224a exiting the air chiller device 100a, decreasing or increasing the chilling capacity of either or both of the primary and secondary chiller subsystems 102, 106 (e.g., via the primary and secondary thermoelectric modules 210, 220) depending upon the sensed air temperature.

In embodiments, the control processors 302 and the temperature sensors 304, 306 are disposed within the housing (120, FIG. 1) of the air chiller device 100a. In some embodiments, one or more of the temperature sensors (e.g., the temperature sensor 306) may be disposed outside the housing 120 but proximate to the main air return fans 228.

Figure 4A:
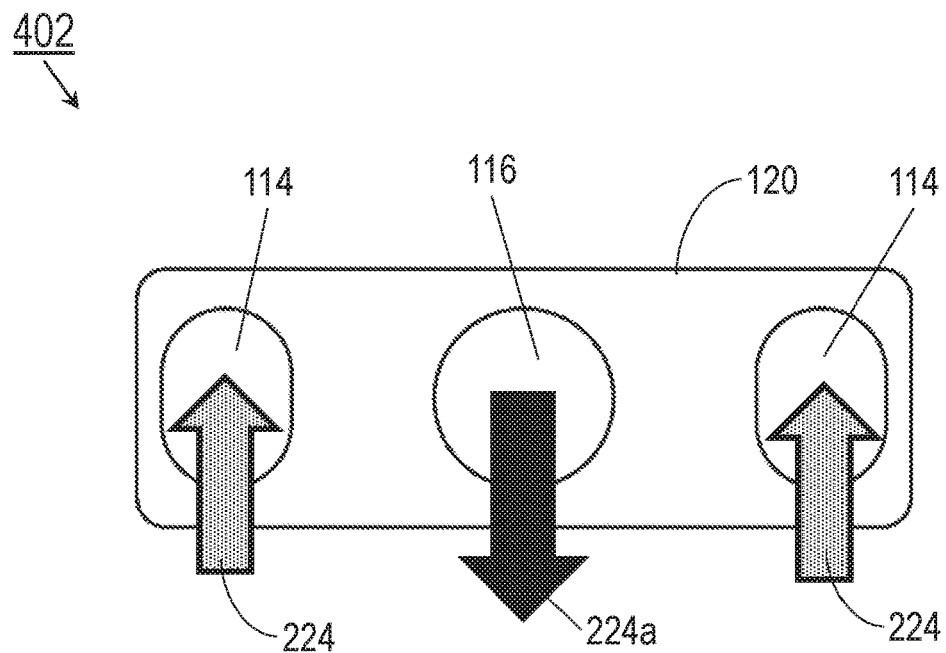
FIGS. 4A and 4B are respectively forward and aft profile views of the air chiller device of FIG. 1.

Referring to FIG. 4A, in some embodiments the housing 120 of the air chiller device (100, FIG. 1) may incorporate, at a first end 402, the main air intakes 114 through which the secondary chiller subsystem (106, FIG. 1) may receive the recirculating air stream 224. Similarly, at the first end 402 the air chiller device 100 may incorporate the main air returns 116 through which the chilled recirculating air stream 224a may be returned to the surrounding environment.

Figure 4B:
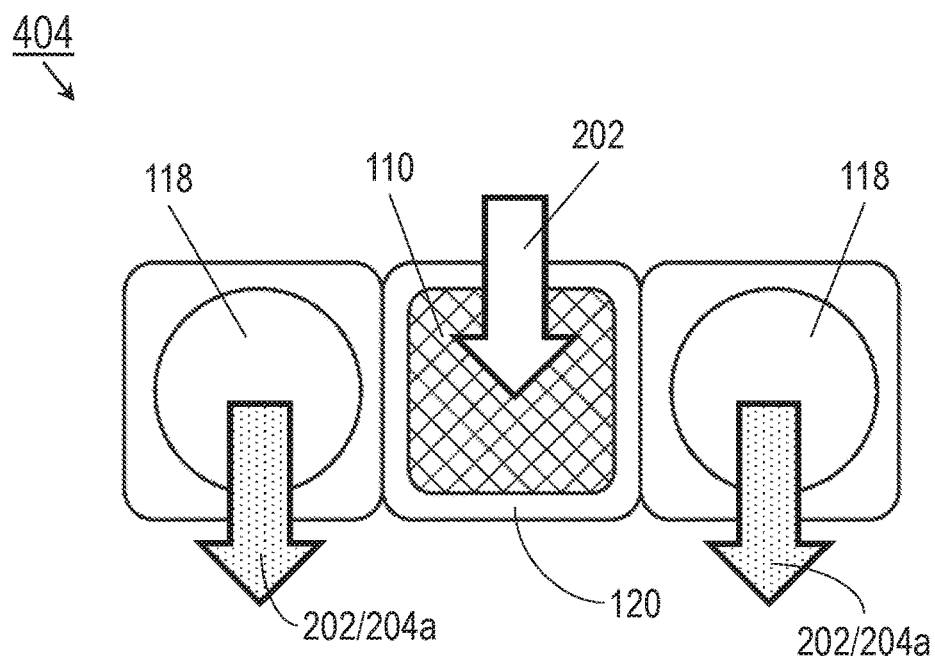

Referring to FIG. 4B, the housing 120 may incorporate, at a second end 404 opposite the first end 402, the primary air intakes 110 through which the primary chiller subsystem 102 may receive the primary ambient air supply 202. Similarly, at the second end 404 the air chiller device 100 may incorporate the exhaust ports 118 for directing the primary and secondary ambient air supplies (202, 204a) from the air chiller device after contact with the primary chiller subsystem 102 (e.g., and heat absorption therefrom). In some embodiments, air evacuated from the air chiller device 100 via the exhaust ports 118 may be channeled out of the passenger cabin, e.g., into dome or underfloor areas, cargo holds, or other portions of the aircraft.

Referring to FIGS. 5A and 5B, the galley environment 500 may include a portion of an aircraft cabin wherein a galley structure 502 (e.g., galley monument) is installed, e.g., laterally within a galley area or aft of the main passenger cabin.

In embodiments, the air chiller device 100 may be mounted to an exterior surface of the galley structure 502 to chill a recirculating air supply 224 that enters the air chiller device via cold-air return ducts 504 connected to the main air intakes 114 and re-enters the galley structure via cold-air supply ducts 506 connected to the main air return 116 after chilling via the secondary chiller subsystem (106, FIG. 1). The chilled recirculating air supply 224a may circulate throughout interior airspaces within the galley structure 502 in order to maintain the interior airspaces (as well as any items stowed therewithin) at a desired or necessary temperature. For example, the interior airspaces of the galley structure 502 may include one or more galley cart bays 508 capable of stowing a galley cart 510 (e.g., trolley) within which perishable food items may be stored for in-seat meal or refreshment services to passengers. The chilled recirculating air supply 224a may maintain the galley cart 510 and its contents at or below the required storage temperature.

In some embodiments, the galley structure 502 may incorporate workdecks 512 at approximately waist level to provide cabin crew with a flat work surface, e.g., for food or beverage preparation. The chilled recirculating air supply 224a may be directed to and around chiller compartments 514 mounted within the galley structure 502 above the level of the workdeck 512, such that the chiller compartments may be used for additional storage of perishable items. Primary and secondary ambient air supplies (202, 204a) channeled through the primary chiller subsystem (102, FIG. 1) may be directed away from the air chiller device 100 and the galley structure 502 (e.g., into dome or underfloor areas of the aircraft) via exhaust ducts 516 fed by the exhaust ports (118, FIG. 1).

Figure 5D:
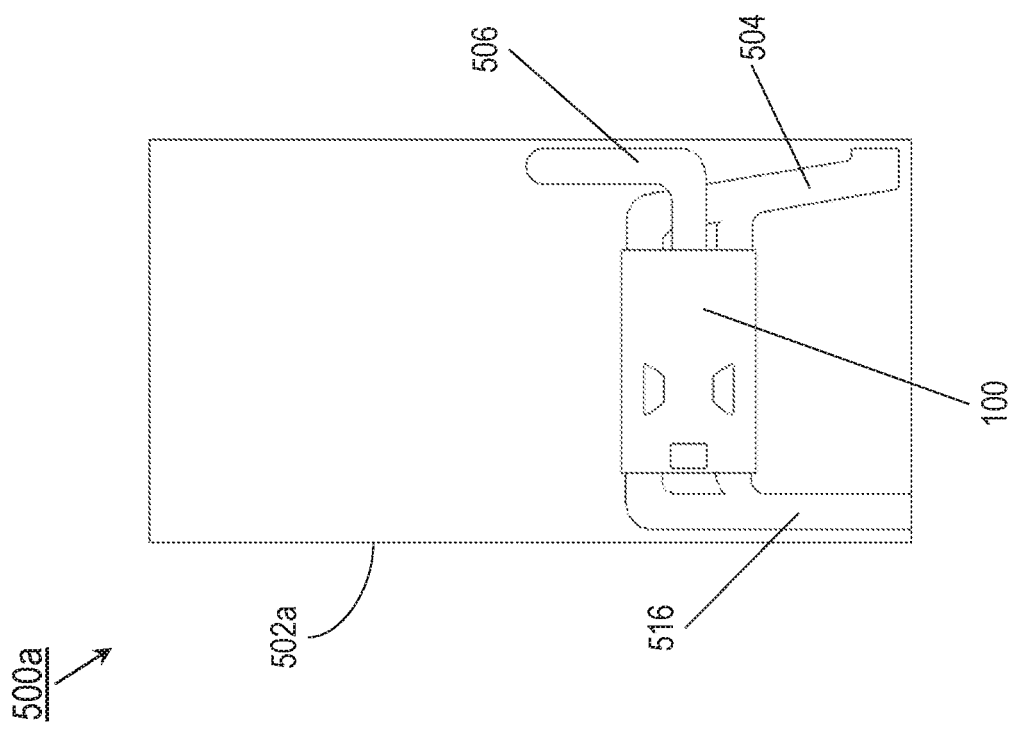
FIGS. 5C and 5D are respectively side and rear elevational views of an aircraft galley environment incorporating the air chiller device of FIG. 1.
Figure 5C:
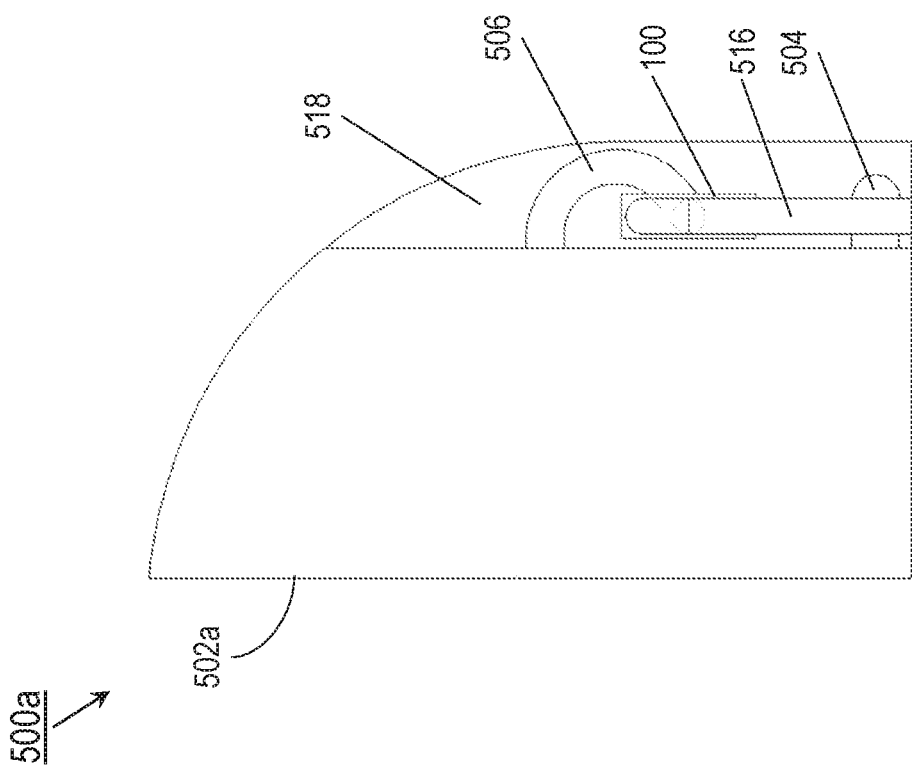

Referring to FIGS. 5C and 5D, the galley environment 500a and galley structure 502a may be implemented and may function similarly to the galley structure 500 of FIGS. 5A and 5B, except that the air chiller device 100 may be mounted to the galley structure 502a in a transverse orientation within a sail area 518 directly adjacent to the galley structure 502a (e.g., between the galley structure and a bulkhead). Similarly, one or more of the cold-air return ducts 504, cold-air supply ducts 506, and exhaust ducts 516 connected to the air chiller device 100 and galley structure 502a may be routed through the sail area 518.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

I claim:

1. A flatpack air chiller device, comprising:
   at least one primary air intake configured to receive a primary ambient air supply;
   at least one secondary air intake configured to receive a secondary ambient air supply;
   a primary chiller subsystem comprising:
      at least one primary thermoelectric device in thermal communication with the primary ambient air supply via a primary hot side and with the secondary ambient air supply via a primary cold side, the primary hot side and the primary cold side coupled by at least one primary thermoelectric module, the primary thermoelectric device configured to chill the secondary ambient air supply according to at least one primary voltage through the primary thermoelectric module;
and
at least one internal air intake configured for channeling the chilled secondary ambient air supply to a secondary chiller subsystem;
the secondary chiller subsystem comprising:
at least one main air intake configured to receive a recirculating air supply from an air recirculation network;
at least one secondary thermoelectric device in thermal communication with the chilled secondary air supply via a secondary hot side and with the recirculating air supply via a secondary cold side, the secondary hot side and the secondary cold side coupled by at least one secondary thermoelectric module,
the secondary thermoelectric device configured to chill the recirculating air supply according to at least one secondary voltage through the secondary thermoelectric module;
and
at least one main air outlet configured to channel the chilled recirculating air supply through the air recirculation network;
and
at least one control processor operatively coupled to the primary thermoelectric device and the secondary thermoelectric device and to a power source, the control processor configured to adjust at least one of the primary voltage and the secondary voltage.

2. The flatpack air chiller device of claim 1, wherein:
the primary chiller subsystem includes at least one primary exhaust fan configured to direct the primary ambient air supply from the air chiller device after contact with the primary hot side;
and
the secondary chiller subsystem includes at least one secondary exhaust fan configured to direct the chilled secondary ambient air supply from the air chiller device after contact with the secondary hot side.

3. The flatpack air chiller device of claim 2, further comprising:
at least one exhaust port in communication with the primary exhaust fan and the secondary exhaust fan.

4. The flatpack air chiller device of claim 1, wherein:
the primary chiller subsystem includes at least one primary heat sink thermally coupled to the primary hot side or the primary cold side;
and
the secondary chiller subsystem includes at least one secondary heat sink device thermally coupled to the secondary hot side or the secondary cold side.

5. The flatpack air chiller device of claim 1, further comprising:
at least one temperature sensor operatively coupled to the control processor and configured to sense an air temperature, the control processor configured to adjust at least one of the primary voltage and the secondary voltage based on the sensed air temperature.

6. The flatpack air chiller of claim 5, wherein the at least one temperature sensor includes at least one of:
a primary temperature sensor configured to sense at least one first air temperature associated with the chilled secondary ambient air supply; and
a secondary temperature sensor configured to sense at least one second air temperature associated with the chilled recirculating air supply.

7. An aircraft galley environment, comprising:
at least one galley structure installable in an aircraft cabin, the galley structure enclosing at least one interior airspace therewithin;
an air recirculation network coupled to the galley structure and configured for directing a recirculating air supply through the interior airspace, the air recirculation network including at least one supply duct and at least one return duct;
at least one air chiller device attached to an exterior surface of the galley structure, the air chiller device comprising:
at least one primary air intake configured to receive a primary ambient air supply from an environment proximate to the galley structure;
at least one secondary air intake configured to receive a secondary ambient air supply from the environment;
a primary chiller subsystem comprising:
at least one primary thermoelectric device in thermal communication with the primary ambient air supply via a primary hot side and with the secondary ambient air supply via a primary cold side, the primary hot side and the primary cold side coupled by at least one primary thermoelectric module,
the primary thermoelectric device configured to chill the secondary ambient air supply according to at least one primary voltage through the primary thermoelectric module;
and
at least one internal air intake configured for channeling the chilled secondary ambient air supply to a secondary chiller subsystem;
the secondary chiller subsystem comprising:
at least one main air intake coupled to the at least one supply duct and configured to receive the recirculating air supply therefrom;
at least one secondary thermoelectric device in thermal communication with the chilled secondary air supply via a secondary hot side and with the recirculating air supply via a secondary cold side, the secondary hot side and the secondary cold side coupled by at least one secondary thermoelectric module,
the secondary thermoelectric device configured to chill the recirculating air supply according to at least one secondary voltage through the secondary thermoelectric module;
and
at least one main air return coupled to the at least one return duct and configured to return the chilled recirculating air supply to the interior airspace therethrough;
and
at least one control processor operatively coupled to the primary thermoelectric device and the secondary thermoelectric device and to a power source, the control processor configured to adjust at least one of the primary voltage and the secondary voltage.

8. The aircraft galley environment of claim 7, wherein the at least one interior airspace includes at least one cart bay configured for stowing a galley cart.

9. The aircraft galley environment of claim 7, wherein:
the galley structure includes at least one workdeck;

and the at least one interior airspace includes at least one interior compartment disposed above the workdeck.

10. The aircraft galley environment of claim 7, further comprising:

at least one exhaust duct coupled to the air chiller device and in communication with at least one of the primary air intake and the secondary air intake, the exhaust duct configured for:

directing the primary ambient air supply from the air chiller device after contact with the primary hot side; and directing the chilled secondary ambient air supply from the air chiller device after contact with the secondary hot side.

11. The aircraft galley environment of claim 10, wherein the at least one exhaust duct is configured for directing one or more of the primary ambient air supply and the secondary ambient air supply to at least one of a dome area of the aircraft and an underfloor area of the aircraft.

12. The aircraft galley environment of claim 7, wherein the air chiller device further comprises:

at least one temperature sensor operatively coupled to the control processor and configured to sense an air temperature, the control processor configured to adjust at least one of the primary voltage and the secondary voltage based on the sensed air temperature.

13. The aircraft galley environment of claim 12, wherein the at least one temperature sensor includes at least one of:

a primary temperature sensor configured to sense at least one first air temperature associated with the chilled secondary ambient air supply; and a secondary temperature sensor configured to sense at least one second air temperature associated with the chilled recirculating air supply.

* * * * *